US008324726B2

(12) United States Patent
Okumura et al.

(10) Patent No.: US 8,324,726 B2
(45) Date of Patent: Dec. 4, 2012

(54) SEMICONDUCTOR DEVICE, ELECTRODE MEMBER AND ELECTRODE MEMBER FABRICATION METHOD

(75) Inventors: Katsuya Okumura, Tokyo (JP);
Yoshikazu Takahashi, Tokyo (JP);
Kazunori Takenouchi, Kirishima (JP)

(73) Assignees: Octec, Inc., Tokyo (JP); Fuji Electric Co., Ltd., Kawasaki (JP); Kyocera Corporation, Kyoto (JP)

( * ) Notice: Subject to any disclaimer, the term of this patent is extended or adjusted under 35 U.S.C. 154(b) by 0 days.

(21) Appl. No.: 11/351,338

(22) Filed: Feb. 10, 2006

(65) Prior Publication Data
US 2006/0192253 A1 Aug. 31, 2006

(30) Foreign Application Priority Data

Feb. 28, 2005 (JP) ................................. 2005-052389

(51) Int. Cl.
H01L 23/34 (2006.01)
(52) U.S. Cl. ......................... 257/723; 257/724; 257/688
(58) Field of Classification Search .................. 257/181, 257/723, 724, 688, 785, 758, 728
See application file for complete search history.

(56) References Cited

U.S. PATENT DOCUMENTS

| 5,468,681 | A | 11/1995 | Pasch | |
|---|---|---|---|---|
| 6,306,680 | B1 * | 10/2001 | Fillion et al. | 438/106 |
| 6,420,252 | B1 * | 7/2002 | Schwed et al. | 438/597 |
| 6,469,398 | B1 * | 10/2002 | Hori | 257/796 |
| 2002/0140089 | A1 * | 10/2002 | Mimino et al. | 257/728 |
| 2004/0038496 | A1 | 2/2004 | Lee et al. | |
| 2005/0167842 | A1 * | 8/2005 | Nakamura | 257/758 |
| 2007/0040186 | A1 * | 2/2007 | Fillion et al. | 257/177 |

FOREIGN PATENT DOCUMENTS

| EP | 0 896 367 A | 2/1999 |
|---|---|---|
| JP | 2002-299497 | 10/2002 |
| JP | 2003-234447 | 8/2003 |
| JP | 2004-006603 | 1/2004 |
| JP | 2004-47598 | 2/2004 |
| JP | 2004-311574 | 11/2004 |

OTHER PUBLICATIONS

Office Action issued by the Japanese Patent Office on Mar. 9, 2010 in the related Japanese application No. 2005-052389.
Office Action issued by the German Patent Office on May 11, 2010 in the related German patent application No. 10 2006 009 021.7-33.
Information Statement submitted to the Japanese Patent Office on Sep. 25, 2012 in the corresponding Japanese patent application No. 2010-195522.
Notification of Information Statement issued by the Japanese Patent Office on Oct. 23, 2012 in the corresponding Japanese patent application No. 2010-195522.

* cited by examiner

Primary Examiner — Phat X Cao
(74) Attorney, Agent, or Firm — Staas & Halsey LLP

(57) ABSTRACT

A semiconductor device that improves the heat cycle resistance and power cycle resistance of a power module. An electrode member in which copper posts are formed in a plurality of perforations cut in a support made of a ceramic material is soldered onto a side of an IGBT where an emitter electrode is formed. By soldering the copper posts onto the electrode, heat generated in the IGBT is transferred to the electrode member and is radiated. In addition, even if a material of which the IGBT is made and copper differ in thermal expansivity, stress on a soldered interface is reduced and distortion is reduced. This suppresses the appearance of a crack. As a result, the heat cycle resistance and power cycle resistance of a power module can be improved.

17 Claims, 18 Drawing Sheets

SEMICONDUCTOR DEVICE, ELECTRODE MEMBER AND ELECTRODE MEMBER FABRICATION METHOD

CROSS-REFERENCE TO RELATED APPLICATIONS

This application is based upon and claims the benefits of priority from the prior Japanese Patent Application No. 2005-052389, filed on Feb. 28, 2005, the entire contents of which are incorporated herein by reference.

BACKGROUND OF THE INVENTION (1) Field of the Invention

This invention relates to a semiconductor device, an electrode member, and an electrode member fabrication method and, more particularly, to a semiconductor device used in a high-current high-voltage operating environment, an electrode member used in such a semiconductor device, and a method for fabricating such an electrode member.

(2) Description of the Related Art

In recent years power modules which can withstand high-current high-voltage operating environments have been utilized in power converters, such as inverters/converters, for driving motors included in robots, machine tools, electric vehicles, and the like. At present, such power modules are made up mainly of power semiconductor elements, such as insulated gate bipolar transistors (IGBTs) and free wheeling diodes (FWDs) (see, for example, Japanese Unexamined Patent Publication No. 2004-6603).

FIG. 17 is a schematic sectional view of an important part of a conventional power module.

FIG. 17 shows how an IGBT 100 is mounted in a power module. Usually an emitter electrode and a gate electrode (hereinafter referred to as the "emitter electrode etc.") are formed on one side of the IGBT 100 and a collector electrode is formed on the other side of the IGBT 100. In FIG. 17, it is assumed that the IGBT 100 is mounted with the emitter electrode etc. upward and the collector electrode downward. As shown in FIG. 17, for example, the emitter electrode etc. formed on the upper side of the IGBT 100 are connected to corresponding external connection terminals (not shown) by aluminum wires 101.

On the other hand, the collector electrode formed on the under side of the IGBT 100 is located on an insulating board 102 on a copper (Cu) heat radiation base (not shown and herein after referred to as the "copper base"). The insulating board 102 is a ceramic plate made of, for example, alumina which transmits heat well. Copper leaves 102a and 102b are attached to both sides of the insulating board 102. The copper leaf 102a attached to the upper side of the insulating board 102 is soldered onto the collector electrode and the copper leaf 102b attached to the under side of the insulating board 102 is soldered onto the copper base. By adopting such a structure, electrical connection between the IGBT 100 and the outside can be secured, insulation between the IGBT 100 and a heat radiation system can be secured, and heat generated at operating time can be transmitted to the copper base via the insulating board 102.

With the above conventional mounting method, heat can be radiated from the under side of the IGBT 100 via the insulating board 102 and the copper base. However, only the thin aluminum wires 101 with a diameter of, for example, about 300 to 400 μm are connected to the upper side of the IGBT 100. In addition, the aluminum wires 101 generate heat as a result of sending an electric current. Accordingly, it can hardly be hoped that heat will be radiated from the upper side of the IGBT 100. Moreover, heat generated by the aluminum wires 101 may degrade the characteristics of the element. It is possible to use copper wires having high thermal conductivity in place of the aluminum wires 101. However, usually a certain number of wires corresponding to current capacity are ultrasonic-bonded onto the surface of the IGBT 100. Therefore, it is desirable that copper wires the hardness of which is higher than that of the aluminum wires 101 should not be used so as not to damage the surface of the element.

FIG. 18 is a schematic sectional view of an important part of another conventional power module. Components in FIG. 18 that are the same as those shown in FIG. 17 are marked with the same reference numerals and detailed descriptions of them will be omitted.

To avoid the problems which arise by the use of an aluminum wire, an attempt shown in FIG. 18 has conventionally been made. In FIG. 18, a copper electrode 103 is soldered onto the upper side of an IGBT 100 where an emitter electrode etc. are formed. An external connection terminal 104 drawn out of the power module is bonded to the copper electrode 103. By doing so, electrical connection between the IGBT 100 and the outside is secured and heat can also be radiated from the upper side of the IGBT 100 via the copper electrode 103.

The same applies to the case where an FWD is mounted in a power module. For example, an anode electrode is formed on the upper side of the FWD and a cathode electrode is formed on the under side of the FWD. Aluminum wires are ultrasonic-bonded onto or a copper electrode is soldered onto the upper side of the FWD. The under side of the FWD is soldered onto a copper leaf attached to an insulating board on a copper base.

However, the thermal expansivity of silicon (Si) which is the main component of the IGBT or the FWD is about 2.6 ppm/° C. On the other hand, the thermal expansivity of copper is about 17 ppm/° C. and is higher than that of silicon. Therefore, if a copper electrode is soldered onto the upper side of the IGBT or the FWD in the above way in place of aluminum wires with heat radiation taken into consideration, a soldered interface is subject to thermal stress at the time of heat cycling or power cycling because of the difference in thermal expansivity between them. Distortion is caused by this thermal stress. As a result, a crack may appear and the target life of the power module may not be realized.

A crack may also appear under the IGBT or the FWD. That is to say, the thermal expansivity of the insulating board which is made of alumina and to the surface of which the copper leaf is attached is about 7 ppm/° C. This insulating board is soldered onto the copper base the thermal expansivity of which is high. Accordingly, a soldered interface is subject to thermal stress because of the difference in thermal expansivity between them. Distortion is caused by this thermal stress and a crack may appear. It is known that if heat cycling is performed between, for example, −40 and +125° C., a crack begins to appear due to distortion at the soldered interface between the insulating board and the copper base after about 500 cycles.

The reason for using copper as a material for heat radiation bases in power modules is that copper has good thermal conductivity (about 350 W/(m·K)). However, to avoid the appearance of such a crack, a material, such as the one including copper molybdenum (CuMo) or aluminum silicon carbide (AlSiC), the thermal expansivity of which is close to 7 ppm/° C. has been used in place of copper. The thermal expansivity of these materials is lower than that of copper, but their thermal conductivity is low (about 150 W/(m·K)). This characteristic is disadvantageous to recent small-loss IGBTs and FWDS. In addition, the costs of manufacturing heat radiation bases by using these materials are about twenty times higher than the manufacturing costs of copper bases.

SUMMARY OF THE INVENTION

The present invention was made under the background circumstances described above. An object of the present invention is to provide a semiconductor device with great reliability in which heat internally generated is efficiently radiated and in which thermal stress on an internal interface between members joined is reduced.

Another object of the present invention is to provide an electrode member capable of efficiently radiating heat generated in a semiconductor device and reducing thermal stress on an internal interface between members joined and a method for fabricating such an electrode member.

In order to achieve the above first object, a semiconductor device having a semiconductor element with an electrode on a surface is provided. This semiconductor device comprises an electrode member including an insulating support with a plurality of perforations which pierce through principal planes and metal posts which are located in the plurality of perforations and which are joined to the electrode.

In order to achieve the above second object, an electrode member joined to an electrode of a semiconductor device is provided. This electrode member comprises an insulating support with a plurality of perforations which pierce through principal planes and metal posts located in the plurality of perforations.

In order to achieve the above second object, a method for fabricating an electrode member joined to an electrode of a semiconductor device. This electrode member fabrication method comprises the step of forming metal posts in a plurality of perforations which pierce through principal planes of an insulating support by impregnating the insulating support with metal.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Embodiments of the present invention applied to, for example, a power module including an IGBT and an FWD will now be described in detail with reference to the drawings.

A first embodiment of the present invention will be described first.

Figure 1:
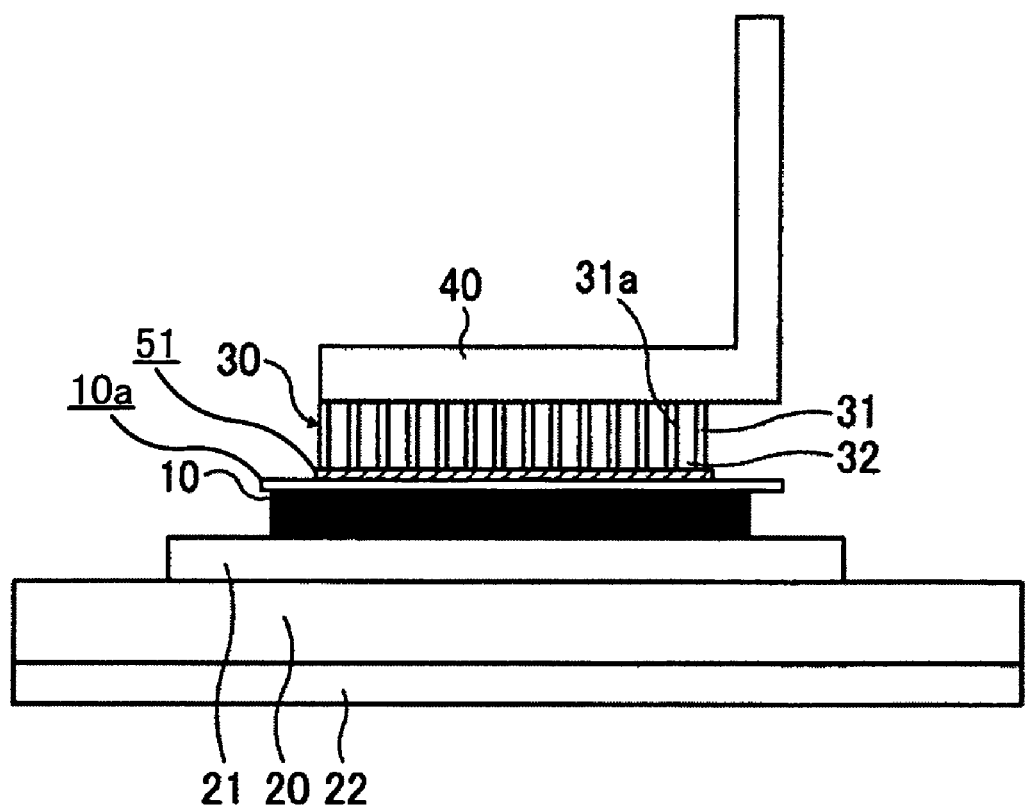
FIG. 1 is a schematic sectional view of an important part of a power module according to a first embodiment of the present invention.
Figure 2:
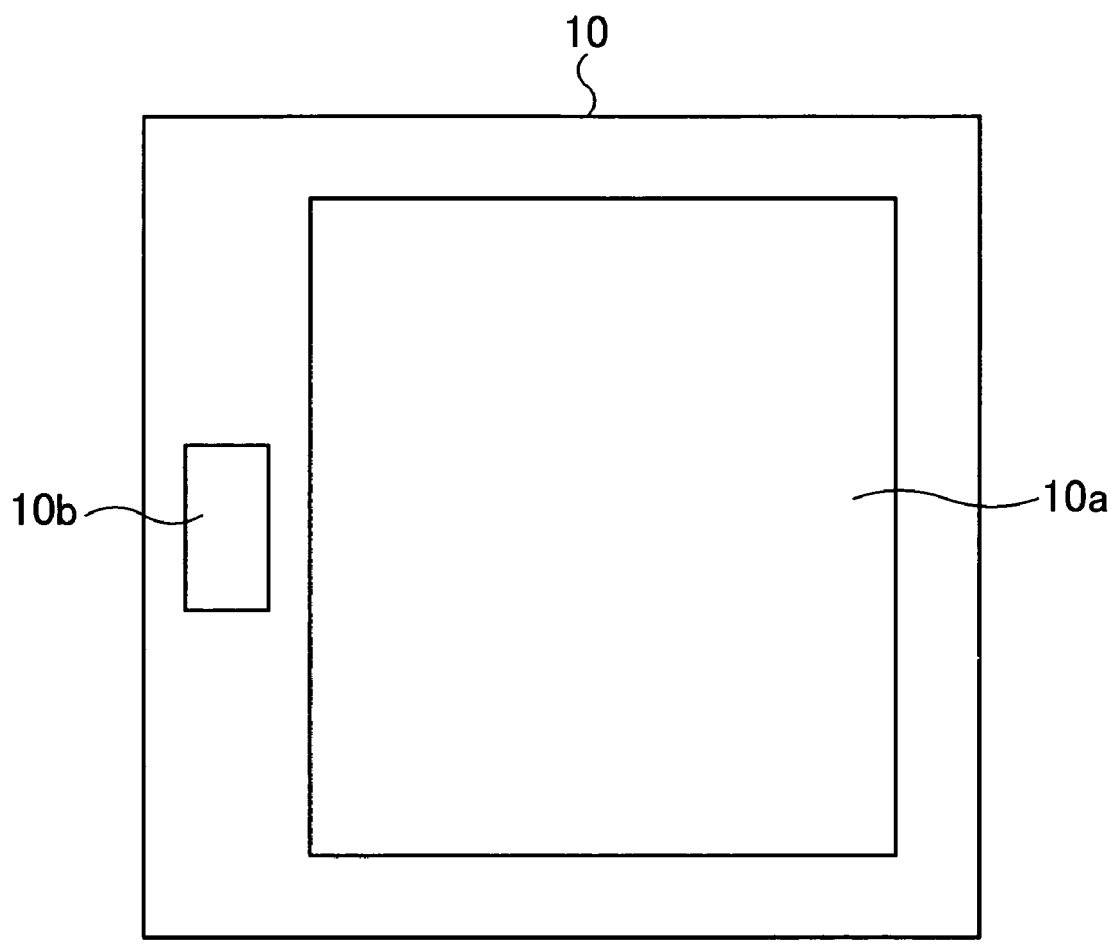
FIG. 2 is a schematic plan view of an important part of an example of an IGBT used in the power module according to the first embodiment of the present invention.
Figure 3A:
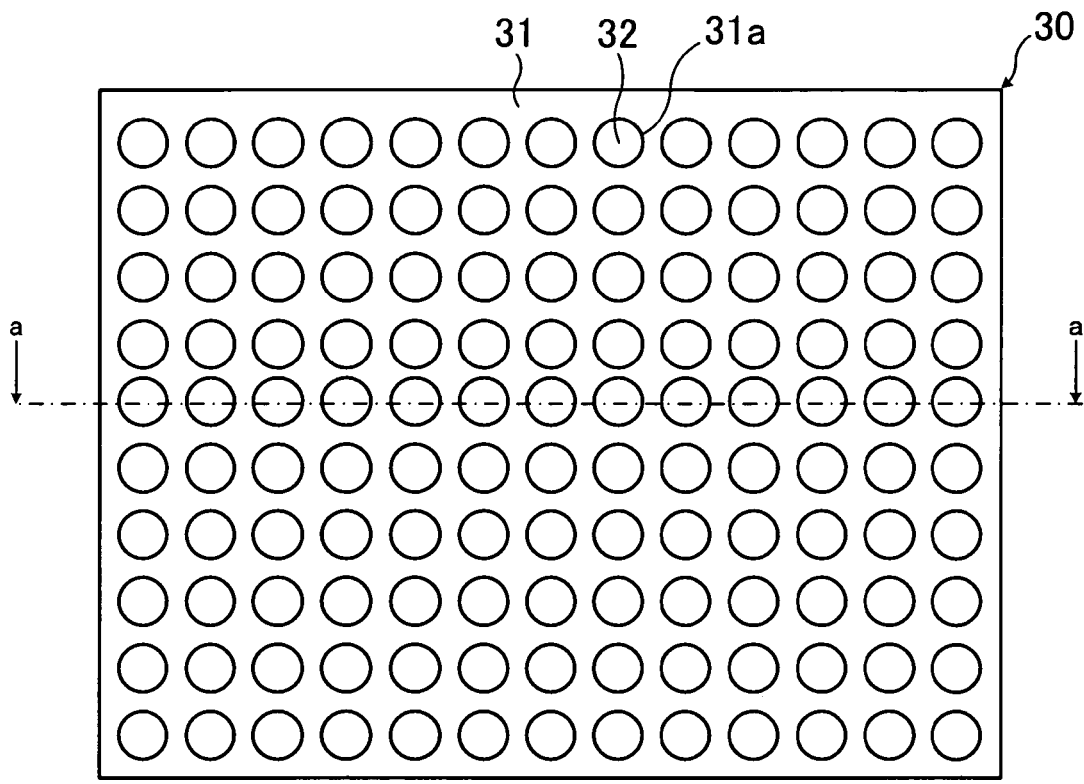
FIGS. 3A and 3B are schematic views of an electrode member according to a first embodiment of the present invention, FIG. 3A being a plan view of the electrode member, FIG. 3B being a sectional view taken along the line a-a of FIG. 3A.
Figure 3B:
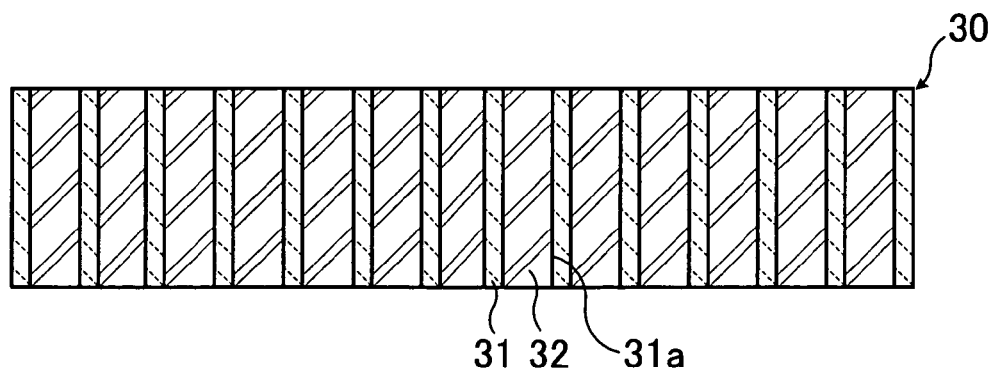

FIG. 1 is a schematic sectional view of an important part of a power module according to a first embodiment of the present invention. FIG. 2 is a schematic plan view of an important part of an example of an IGBT used in the power module according to the first embodiment of the present invention. FIGS. 3A and 3B are schematic views of an electrode member according to a first embodiment of the present invention. FIG. 3A is a plan view of the electrode member. FIG. 3B is a sectional view taken along the line a-a of FIG. 3A.

An emitter electrode 10a and a gate electrode 10b are formed on one side of an IGBT 10 shown in FIG. 2. A collector electrode is formed on the other side (not shown) of the IGBT 10. As shown in FIG. 1, with a power module including, for example, the IGBT 10, the collector electrode is soldered onto an insulating board 20 and the emitter electrode 10*a* is soldered onto an electrode member 30.

The insulating board 20 is made of a ceramic material, such as alumina, which conducts heat well. Copper leaves 21 and 22 which serve as conductor patterns and the like are attached to the surfaces of the insulating board 20. The copper leaf 21 attached to the upper side of the insulating board 20 and the collector electrode formed on the IGBT 10 are soldered together. The copper leaf 22 attached to the under side of the insulating board 20 and a copper base (not shown) beneath the copper leaf 22 used as a heat radiation base are soldered together. When the power module is formed, the insulating board 20 is used for realizing a dielectric strength of 5,000 volts or higher between the side where the IGBT 10 is mounted and the copper base side.

As shown in FIG. 3, the electrode member 30 comprises a support 31 which is made of a ceramic material, such as alumina or cordierite, and in which a plurality of perforations 31*a* which pierce through principal planes are formed like an array and copper posts 32 formed by embedding copper in the plurality of perforations 31*a*. As shown in FIG. 1, one end of each copper post 32 included in the electrode member 30 is soldered onto the emitter electrode 10*a* of the IGBT 10 and the other end of each copper post 32 included in the electrode member 30 is soldered onto an external connection terminal and copper electrode (hereinafter simply referred to as the "copper electrode") 40.

By joining the electrode member 30 to the emitter electrode 10*a*, for example, of the IGBT 10, heat generated in the IGBT 10 can be radiated efficiently and distortion at an interface between the IGBT 10 and the electrode member 30 caused by the difference in thermal expansion between the electrode member 30 and the IGBT 10 can be reduced. The reason for this is as follows.

Copper (copper posts 32) which is included in the electrode member 30 and which has high thermal conductivity is joined to the emitter electrode 10*a* of the IGBT 10, so heat radiation is promoted by the copper posts 32. This is why heat generated in the IGBT 10 can be radiated efficiently. The thermal expansivity of alumina, being a ceramic material, is about 7 to 8 ppm/° C. In particular, the thermal expansivity of cordierite, being a ceramic material, is about 0.5 to 3 ppm/° C. Accordingly, the thermal expansivity of the ceramic material of which the support 31 is made is lower than that of copper (about 16.5 to 18 ppm/° C.) of which the copper posts 32 are made. Therefore, when the electrode member 30 thermally expands by heat generated in the IGBT 10, the support 31 restrains the thermal expansion of the copper posts 32 and the thermal expansion of the electrode member 30 is suppressed. As a result, the difference in thermal expansion between the IGBT 10 and the electrode member 30 can be narrowed down at an interface where they are joined. This is why distortion at the interface between the IGBT 10 and the electrode member 30 can be reduced.

The electrode member 30 having the above structure is fabricated by, for example, the following methods. A first method is as follows. First, ceramic powder is molded into a molding having a predetermined number of perforations 31*a* at predetermined positions by a press. The support 31 is formed by burning the molding at a high temperature. The support 31 is then impregnated with molten copper so that the molten copper will enter the perforations 31*a*. Copper which has entered the perforations 31*a* is hardened. Copper which remains on the surface is removed by, for example, polishing, if necessary. By doing so, the electrode member 30 including the copper posts 32 is formed. A second method is as follows. The support 31 having the perforations 31*a* is formed in the same way. Metal posts which are made of copper and which can be inserted into the perforations 31*a* are prepared. The metal posts are inserted into the perforations 31*a* of the support 31. The metal posts are integrated into the support 31 by, for example, adhering the metal posts to the support 31 or fitting the metal posts into the support 31. By doing so, the electrode member 30 including the copper posts 32 is formed.

By locating the above electrode member 30 between the IGBT 10 and the copper electrode 40, the IGBT 10 and the copper electrode 40 not only are thermally connected but also are electrically connected by a solder layer 51 at the interface between the copper posts 32 and the emitter electrode 10*a* and by a solder layer (not shown) at an interface between the copper posts 32 and the copper electrode 40.

If comparison is made between the case where the electrode ember 30 in which the copper posts 32 are formed in the above way and the IGBT 10 are joined and the case where the copper electrode 40 on the entire surface of which copper gets exposed and the IGBT 10 are joined, the join area of the two substances which differ in thermal expansivity in the former case is smaller than in the latter case. In the former case, thermal stress on the solder layer at the interface which is created at the time of heat being generated because of the difference between their thermal expansivities is accordingly small. In addition, the solder layer at the interface between the IGBT 10 and the electrode member 30 not only connects them electrically and thermally but also lessens such thermal stress. Moreover, the electrode member 30, together with the copper electrode 40, functions as a heat sink, so heat can efficiently be radiated from the upper side of the IGBT 10. As a result, distortion hardly occurs at the soldered interface and heat cycle resistance and power cycle resistance can be improved.

As stated above, by soldering the electrode member 30 between the IGBT 10 and the copper electrode 40, distortion at the soldered interface between the IGBT 10 and the electrode member 30 can be reduced and heat generated in the IGBT 10 can be radiated efficiently. This significantly suppresses the appearance of a crack at the soldered interface.

Figure 4:
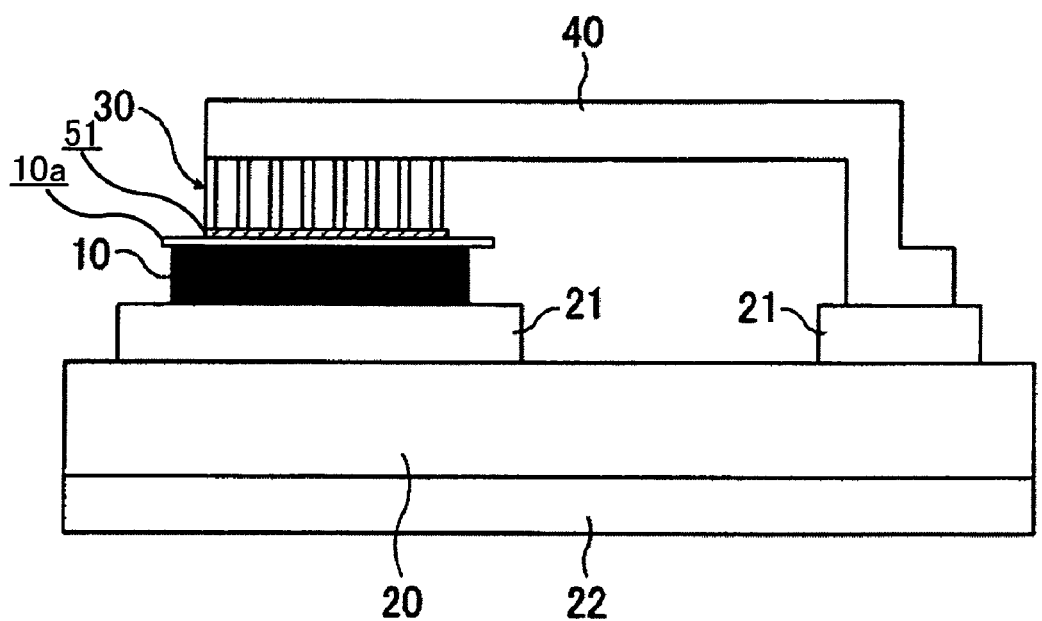
FIG. 4 is a schematic sectional view of an important part of another example of the power module according to the first embodiment of the present invention.

FIG. 4 is a schematic sectional view of an important part of another example of the power module according to the first embodiment of the present invention.

In this first embodiment, a copper electrode 40 is joined onto an electrode member 30. In this case, the copper electrode 40 is used as an external connection terminal as shown in FIG. 1. As shown in FIG. 4, the copper electrode 40 may also be used as a conductor for connecting the electrode member 30 to a second copper leaf 21 on an insulating board 20.

A gate electrode 10*b* (not shown) formed on an IGBT 10 is wired by, for example, wire bonding. In the examples shown in FIGS. 1 through 4, the electrode member 30 is almost equal in size to the emitter electrode 10*a*. However, the size of the electrode member 30 may be equal to that of a chip of the IGBT 10 and the electrode member 30 may also be soldered onto the gate electrode 10*b*. In this case, copper posts 32 connected to the gate electrode 10*b* are treated as a connection conductor for the gate electrode 10*b* and the copper posts 32 should be wired by, for example, wire boding or using the copper electrode 40.

Figure 5:
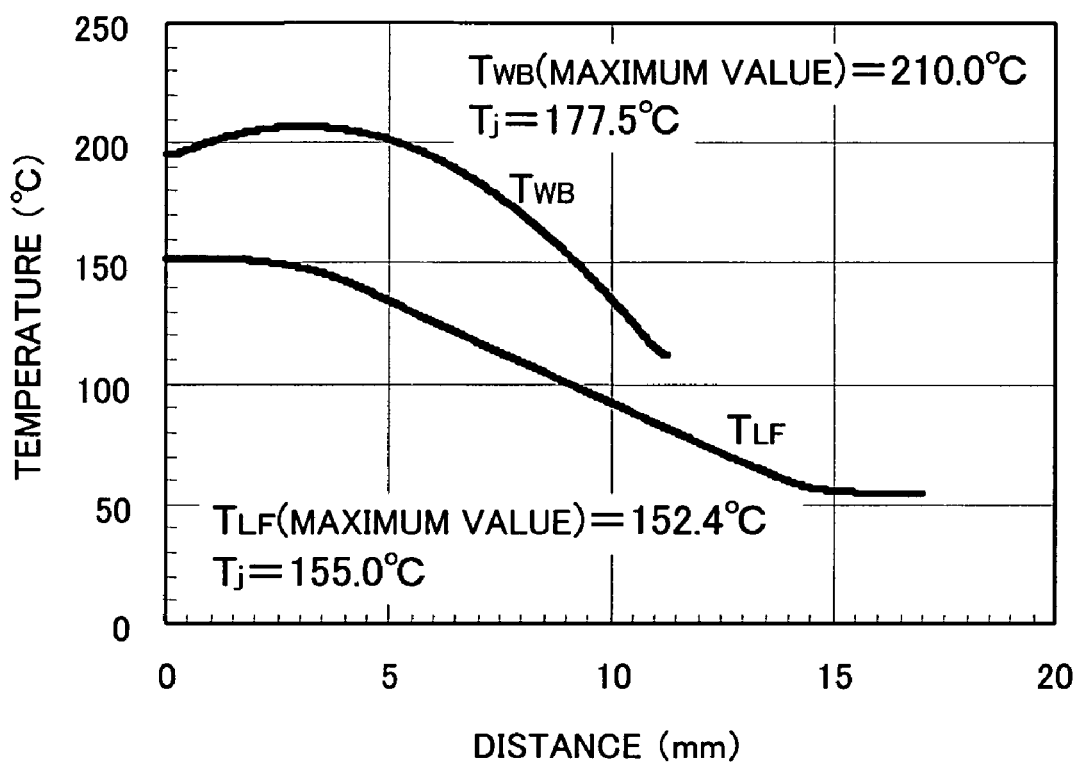
FIG. 5 is a view for describing a heat radiation effect.

FIG. 5 is a view for describing a heat radiation effect.

FIG. 5 shows temperature distribution obtained by passing a steady-state current of 50 $A_{dc}$ in the cases where the emitter electrode 10*a* of the IGBT 10 is connected to the outside by wire bonding and where external connection is made by using a lead frame structure including the electrode member 30 and the copper electrode 40. In FIG. 5, a horizontal axis indicates distance (mm) in the direction of the depth of the power module (direction from the IGBT 10 to the insulating board 20) from a reference point for temperature measurement in each case. A vertical axis indicates temperature (° C.). $T_{WB}$ indicates temperature obtained in the case where wire bonding is used, $T_{LF}$ indicates temperature obtained in the case where a lead frame structure is used, and $T_j$ indicates temperature at a position where a wire or the electrode member 30 is joined to the IGBT 10.

As can be seen from FIG. 5, if wire bonding is used, $T_j$ is 177.5° C. with the surface of the wire as a reference point for temperature measurement (0 mm). On the other hand, the maximum value of $T_{WB}$ is 210.0° C. and is higher than $T_j$. The temperature rises first from the reference point in the direction of the depth of the power module and then goes down with an increase in the depth. This shows that heat is not radiated properly from the inside, and suggests that heat is supplied from the wire itself.

If a lead frame structure is used, $T_j$ is 155.0° C. with the surface of the copper electrode 40 pretty close to the electrode member 30 as a reference point for temperature measurement (0 mm). On the other hand, the maximum value of $T_{LF}$ is 152.4° C. and $T_{LF}$ is lower than $T_j$ at every depth including an area of the electrode member 30. In addition, compared with the case where wire bonding is used, the temperature can significantly be lowered throughout. Therefore, it may safely be said that the electrode member 30 and the copper electrode 40 function as good conductors of heat internally generated.

The above descriptions have been given with the IGBT 10 as an example. If an FWD is included, a cathode electrode of the FWD is soldered onto, for example, the copper leaf 21 on the insulating board 20 and an anode electrode of the FWD is soldered onto the electrode member 30. By doing so, the same structure that was described above is obtained and the same effect that was described above can be achieved.

In the above examples, the electrode member 30 is located only on the emitter electrode 10a or the anode electrode formed on the upper side of the IGBT 10 or the FWD. However, the electrode member 30 may also be located between the collector electrode or cathode electrode formed on the under side of the IGBT 10 or the FWD and the copper leaf 21 attached to the upper side of the insulating board 20 or between the copper leaf 22 attached to the under side of the insulating board 20 and the copper base.

Figure 6A:
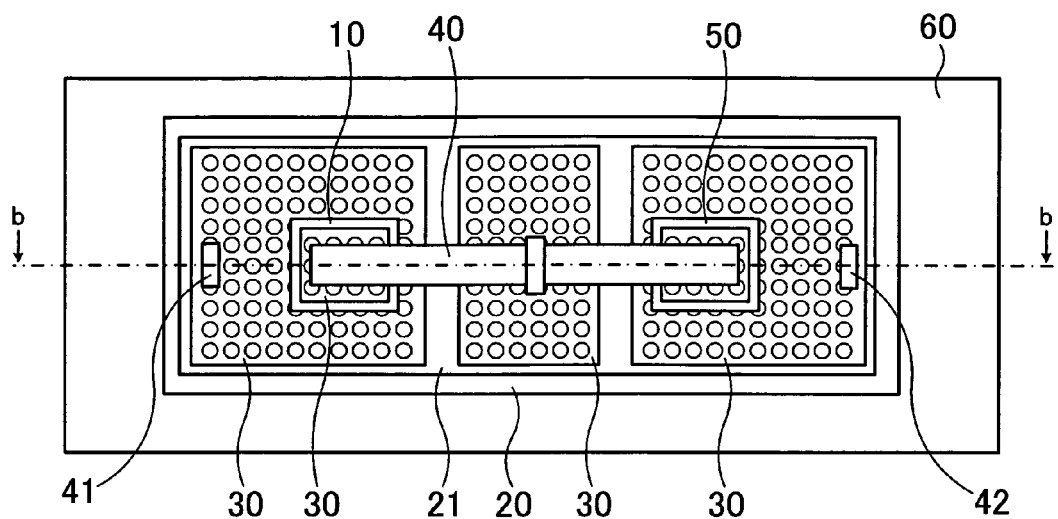
FIGS. 6A and 6B are schematic views of a power module using the electrode member according to the first embodiment of the present invention, FIG. 6A being a plan view of the power module, FIG. 6B being a sectional view taken along the line b-b of FIG. 6A.
Figure 6B:
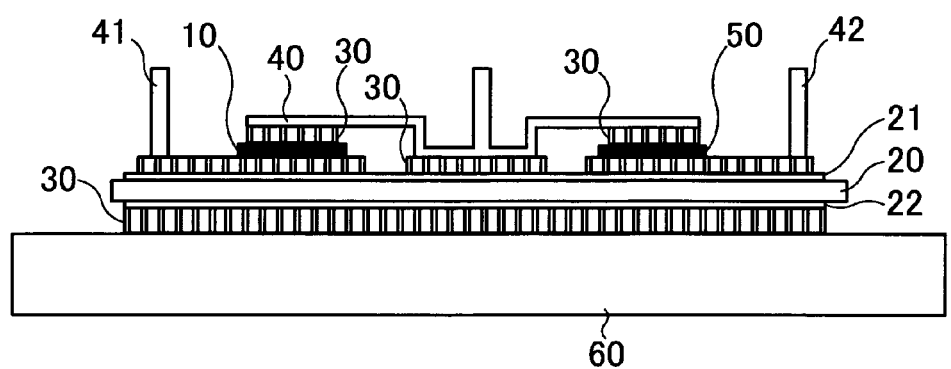

FIGS. 6A and 6B are schematic views of a power module using the electrode member according to the first embodiment of the present invention. FIG. 6A is a plan view of the power module. FIG. 6B is a sectional view taken along the line b-b of FIG. 6A.

In a power module shown in FIG. 6, an IGBT 10 and a copper electrode 40 are connected by an electrode member 30 and an FWD 50 and the copper electrode 40 are connected by an electrode member 30. This is the same with the above examples. In addition, the IGBT 10 and a copper leaf 21 are connected by an electrode member 30, the FWD 50 and the copper leaf 21 are connected by an electrode member 30, the copper electrode 40 and the copper leaf 21 are connected by an electrode member 30, a copper electrode 41 and the copper leaf 21 are connected by the electrode member 30, and a copper electrode 42 and the copper leaf 21 are connected by the electrode member 30. A copper leaf 22 and a copper base 60 are also connected by an electrode member 30. By adopting such a structure, the same effect that was described above can be achieved. That is to say, heat generated in the IGBT 10 and the FWD 50 can efficiently be transmitted to the copper base 60. Furthermore, compared with the case where the electrode members 30 are not used, thermal stress on each soldered interface is relieved, distortion is reduced, and the appearance of a crack is suppressed.

A second embodiment of the present invention will now be described.

Figure 7A:
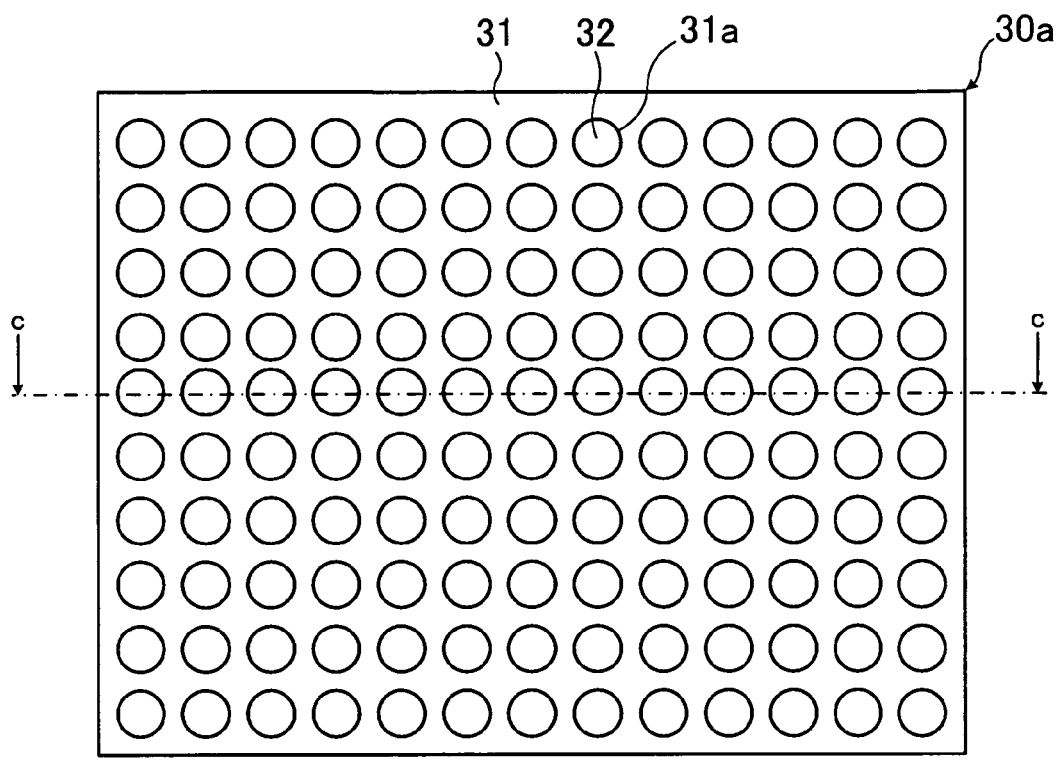
FIGS. 7A and 7B are schematic views of an electrode member according to a second embodiment of the present invention, FIG. 7A being a plan view of the electrode member, FIG. 7B being a sectional view taken along the line c-c of FIG. 7A.
Figure 7B:
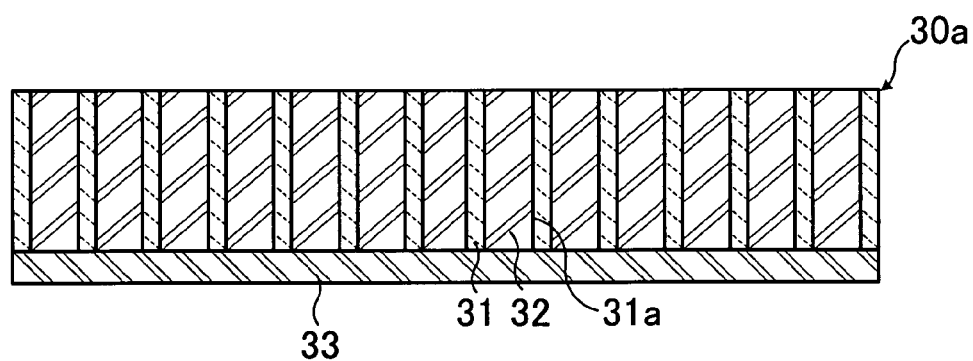

FIGS. 7A and 7B are schematic views of an electrode member according to a second embodiment of the present invention. FIG. 7A is a plan view of the electrode member. FIG. 7B is a sectional view taken along the line c-c of FIG. 7A. Components in FIGS. 7A and 7B that are the same as those shown in FIGS. 3A and 3B are marked with the same reference numerals and detailed descriptions of them will be omitted.

As shown in FIG. 7B, an electrode member 30a according to the second embodiment of the present invention differs from the electrode member 30 according to the first embodiment of the present invention in that a copper layer 33, being a conductor layer, is formed on one side of a support 31.

For example, the electrode member 30a having the above structure can be fabricated by forming the copper layer 33 on one side of the support 31 in which perforations 31a are cut and by filling the perforations 31a with copper by performing electroplating with the copper layer 33 as a seed. The copper layer 33 used as a seed can be formed by, for example, attaching a copper leaf to one side of the support 31 or performing electroless plating. The electrode member 30a may be fabricated by impregnating the support 31 with molten copper and by removing copper only on the other side (opposite to the side where the copper layer 33 is to be left) of the support 31 by, for example, polishing until the support 31 gets exposed. This method is the same as that used for fabricating the electrode member 30 according to the first embodiment of the present invention.

By using the electrode members 30a according to the second embodiment of the present invention in a power module, each element, such as an IGBT or an FWD, and a copper electrode can be connected electrically and thermally. Furthermore, each element and a copper leaf attached to the upper side of an insulating board can be connected electrically and thermally. In addition, a copper leaf attached to the under side of the insulating board and a copper base can be connected electrically and thermally. Moreover, distortion at each soldered interface between members reduces and the appearance of a crack is suppressed. This is the same with the electrode member 30 according to the first embodiment of the present invention. By locating the electrode member 30a between an IGBT or an FWD and a copper electrode with the copper layer 33 opposed to the copper electrode or by locating the electrode member 30a between an IGBT or an FWD and an insulating board with the copper layer 33 opposed to the insulating board, for example, the same effect that is obtained by the electrode member 30 according to the first embodiment of the present invention can be achieved and electrical connection of the electrode member 30a can be secured two-dimensionally by the copper layer 33. Accordingly, the electrode member 30a according to the second embodiment of the present invention is suitable for a place where not only vertical continuity but also horizontal continuity is required.

A third embodiment of the present invention will now be described.

Figure 8A:
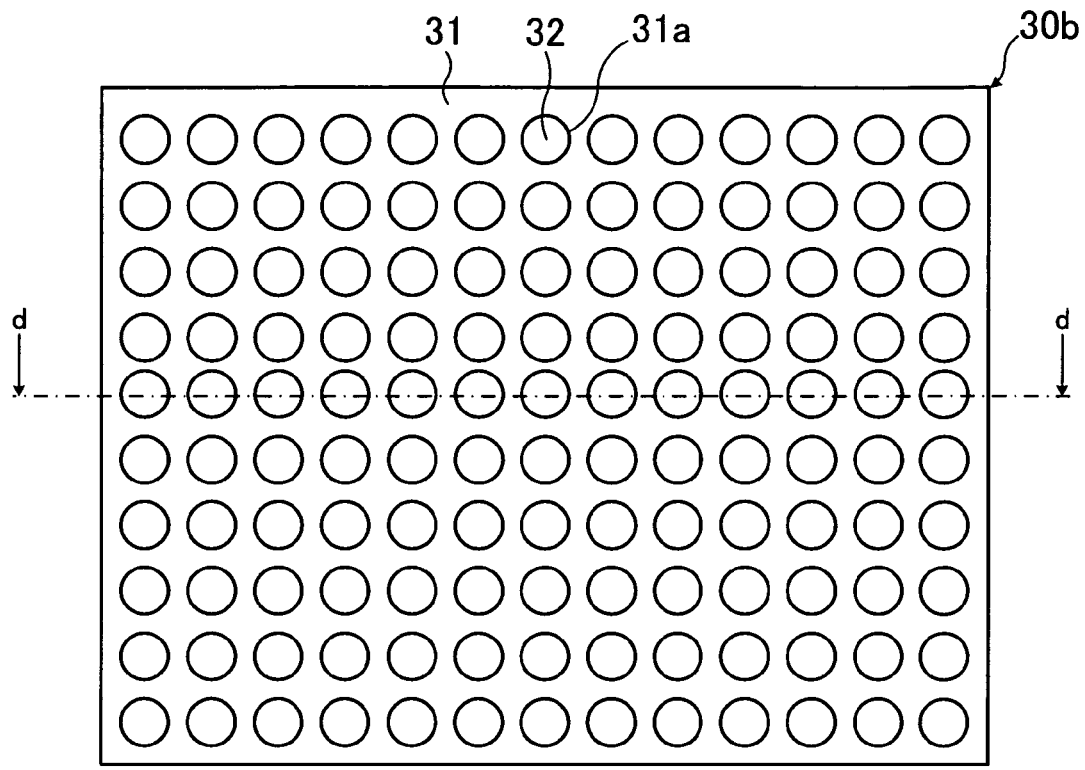
FIGS. 8A and 8B are schematic views of an electrode member according to a third embodiment of the present invention, FIG. 8A being a plan view of the electrode member, FIG. 8B being a sectional view taken along the line d-d of FIG. 8A.
Figure 8B:
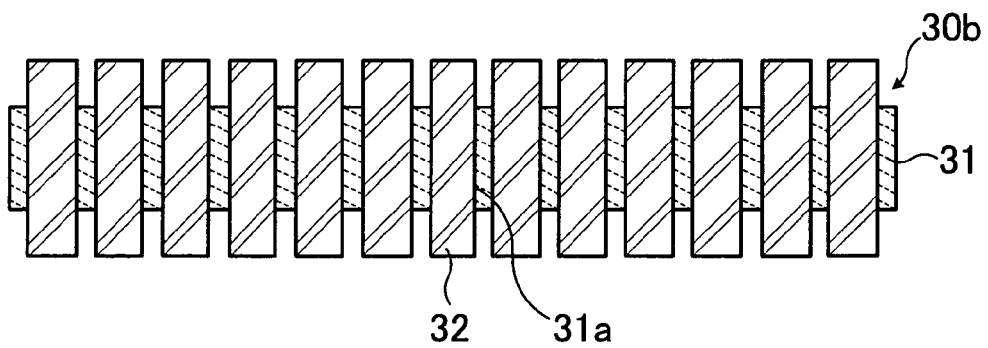

FIGS. 8A and 8B are schematic views of an electrode member according to a third embodiment of the present invention. FIG. 8A is a plan view of the electrode member. FIG. 8B is a sectional view taken along the line d-d of FIG. 8A. Components in FIGS. 8A and 8B that are the same as those shown in FIGS. 3A and 3B are marked with the same reference numerals and detailed descriptions of them will be omitted.

As shown in FIG. 8B, an electrode member 30b according to the third embodiment of the present invention differs from the electrode member 30 according to the first embodiment of the present invention in that end portions of each copper post 32 protrude from both sides of a support 31.

For example, the electrode member 30b having the above structure can be fabricated by forming the copper posts 32 in perforations 31a cut in the support 31 made of a ceramic material and by etching the support 31 from the surface by chemical etching. For example, hydrofluoric acid which can selectively etch a ceramic in respect to metal may be used as etchant used for such chemical etching.

By using the electrode members 30b according to the third embodiment of the present invention in a power module, members between which the electrode member 30b is located can be connected electrically and thermally. Moreover, distortion at each soldered interface between members reduces and the appearance of a crack is suppressed. This is the same with the electrode member 30 according to the first embodiment of the present invention. In addition, the thickness of a solder layer which can relieve thermal stress created at the time of heat being generated in an element can be increased by up to the length of protrusions of the copper posts 32 from the support 31, so the appearance of a crack at each soldered interface can be suppressed further.

In this example, end portions of each copper post 32 protrude from both sides of the support 31. However, the electrode member 30b may have a structure in which one end portion of each copper post 32 may protrude only from one side of the support 31.

A fourth embodiment of the present invention will now be described.

Figure 9A:
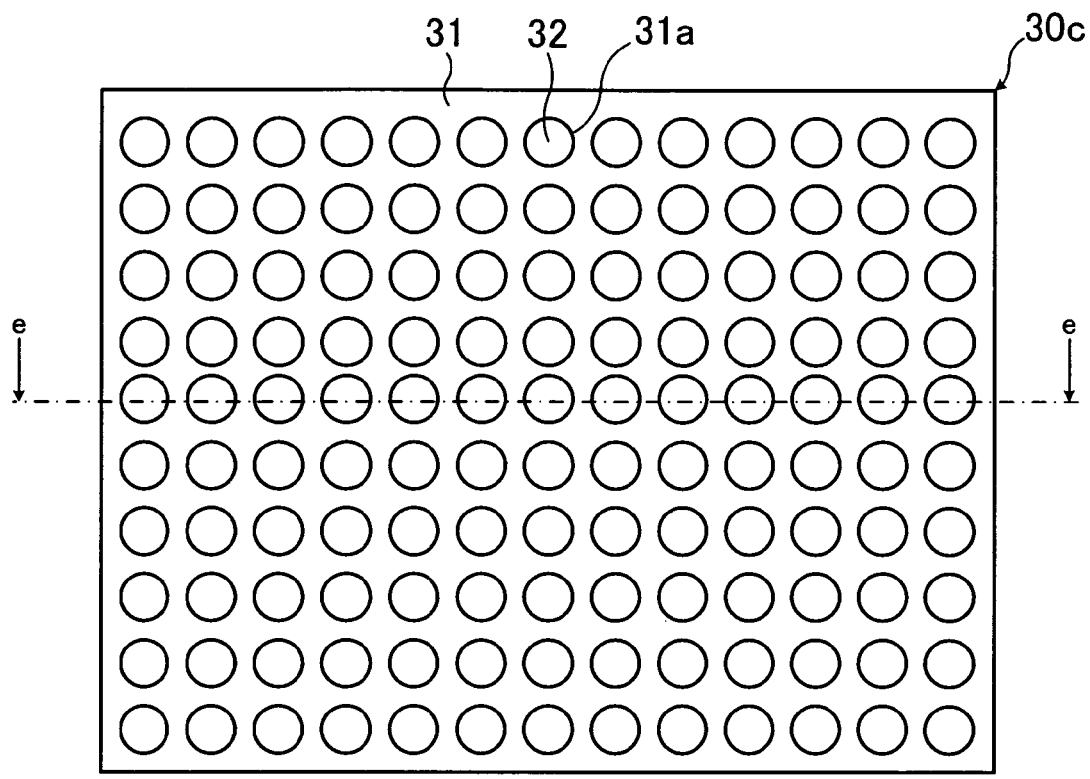
FIGS. 9A and 9B are schematic views of an electrode member according to a fourth embodiment of the present invention, FIG. 9A being a plan view of the electrode member, FIG. 9B being a sectional view taken along the line e-e of FIG. 9A.
Figure 9B:
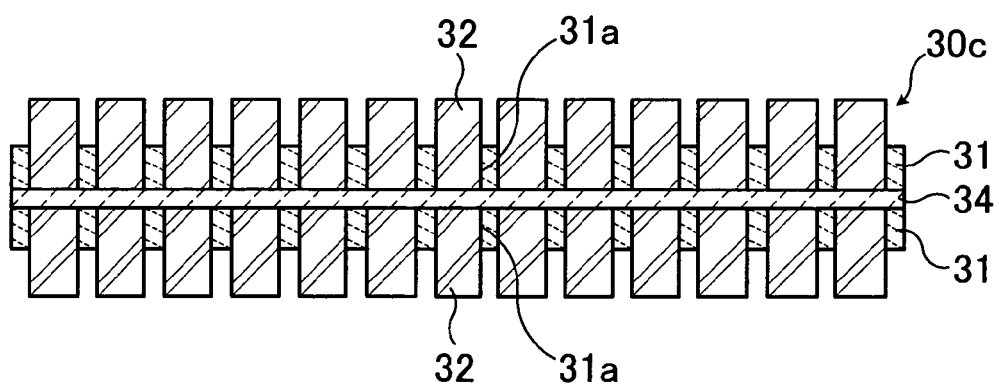

FIGS. 9A and 9B are schematic views of an electrode member according to a fourth embodiment of the present invention. FIG. 9A is a plan view of the electrode member. FIG. 9B is a sectional view taken along the line e-e of FIG. 9A. Components in FIGS. 9A and 9B that are the same as those shown in FIGS. 3A and 3B are marked with the same reference numerals and detailed descriptions of them will be omitted.

As shown in FIG. 9B, an electrode member 30c according to the fourth embodiment of the present invention differs from the electrode member 30 according to the first embodiment of the present invention in that end portions of each copper post 32 protrude from both sides of a support 31 and that the upper half and the lower half of each copper post 32 are internally insulated from each other.

For example, the electrode member 30c having the above structure is fabricated by one of the following two methods. A first method is as follows. The copper posts 32 are formed first in perforations 31a cut in the support 31. The support 31 is selectively etched from one side by using, for example, hydrofluoric acid so that an end portion of each copper post 32 will protrude from this side of the support 31. A second object having the same structure as described above is fabricated in the same way as described above. That is to say, with the second object, too, only one end portion of each copper post 32 protrudes from one side of a support 31. These two objects are then, for example, adhered to each other with an insulating plate 34 located between the other sides of the supports 31 where the other end portion of each copper post 32 does not protrude. By doing so, the electrode member 30c shown in FIGS. 9A and 9B can be fabricated.

A second method is as follows. Holes which do not pierce the support 31 are made in both principal planes of the support 31. The copper posts 32 are formed in the holes. By doing so, the electrode member 30c in which the copper posts 32 formed in one side of the support 31 are internally insulated from the copper posts 32 formed in the other side of the support 31 by the one support 31 can integrally be fabricated. This saves the trouble of, for example, adhering the two objects to each other with the insulating plate 34 between. To make end portions of each copper post 32 protrude from both sides of the support 31 as shown in FIG. 9B, the support 31 in which the copper posts 32 have been formed should selectively be etched by using, for example, hydrofluoric acid.

With the electrode member 30c according to the fourth embodiment of the present invention, the copper posts 32 formed in one side of the support 31 are insulated from the copper posts 32 formed in the other side of the support 31 inside the electrode member 30c. Therefore, by mounting an element, such as an IGBT or FWD, on one principal plane of the electrode member 30c and joining a copper base to the other principal plane of the electrode member 30c as a heat radiation base, the electrode member 30c can be used as an insulating board for insulating the side on which the element is mounted from the side to which the copper base is joined. Moreover, joining is performed with a plurality of copper posts 32 and the thickness of a solder layer can be increased by the length of an end portion of each copper post 32 which protrudes from a side of the support 31. As a result, distortion at each soldered interface between members reduces and the appearance of a crack is suppressed.

In this example, end portions of each copper post 32 protrude from both sides of the support 31. However, only one end portion of each copper post 32 may protrude from one side of the support 31. In addition, end portions of each copper post 32 may not protrude from the support 31. In this case, however, a solder layer becomes thinner.

A fifth embodiment of the present invention will now be described.

Figure 10A:
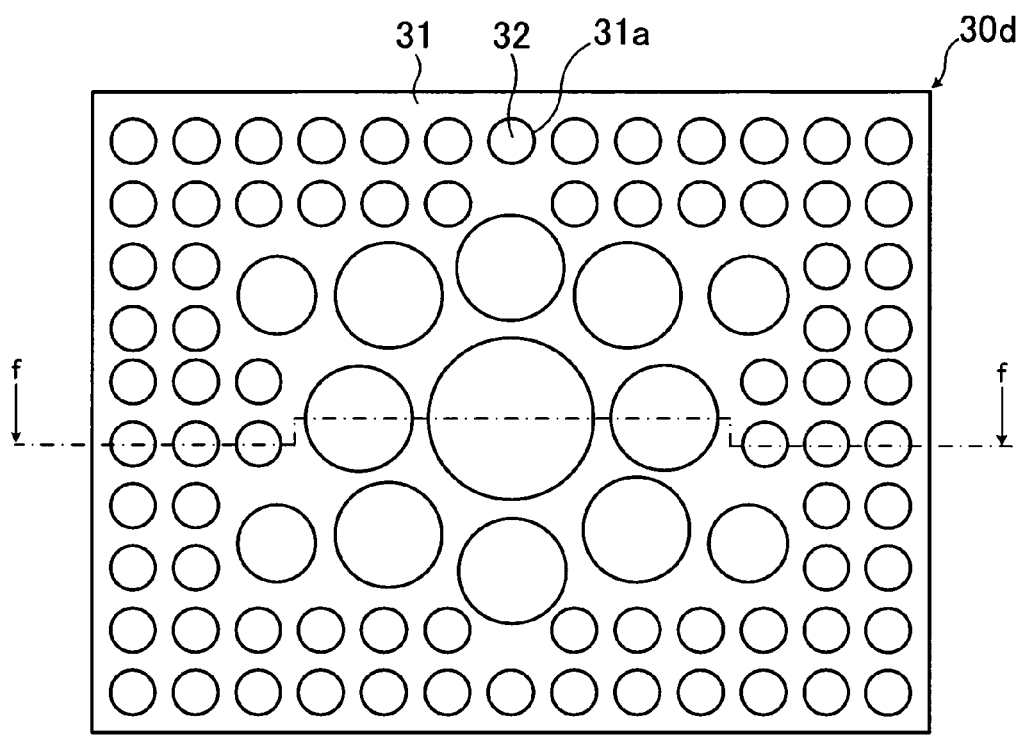
FIGS. 10A and 10B are schematic views of an electrode member according to a fifth embodiment of the present invention, FIG. 10A being a plan view of the electrode member, FIG. 10B being a sectional view taken along the line f-f of FIG. 10A.
Figure 10B:
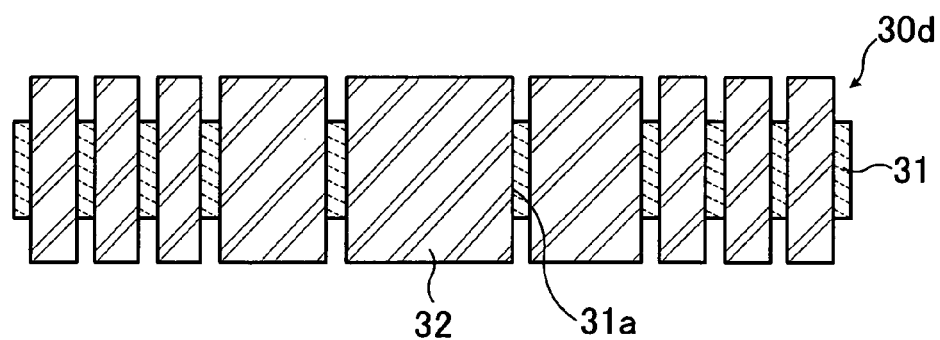

FIGS. 10A and 10B are schematic views of an electrode member according to a fifth embodiment of the present invention. FIG. 10A is a plan view of the electrode member. FIG. 10B is a sectional view taken along the line f-f of FIG. 10A. Components in FIGS. 10A and 10B that are the same as those shown in FIGS. 3A and 3B are marked with the same reference numerals and detailed descriptions of them will be omitted.

As shown in FIGS. 10A and 10B, an electrode member 30d according to the fifth embodiment of the present invention differs from the electrode member 30 according to the first embodiment of the present invention in that end portions of each copper post 32 protrude from both sides of a support 31, that the cross-sectional area (diameter) of a copper post 32 at the center is the largest, that the cross-sectional area of a copper post 32 gradually becomes smaller with an increase in the distance from the center, and that the density of copper posts 32 increases with an increase in the distance from the center.

For example, the electrode member 30d having the above structure is fabricated by the following method. Perforations 31a are cut first in the support 31. The diameter of a perforation 31a at the center is the largest and the diameter of a perforation 31a becomes smaller with an increase in the distance from the center. The density of the perforations 31a increases with an increase in the distance from the center. The copper posts 32 is formed in the perforations 31a. The support 31 is selectively etched from the surface by chemical etching. As a result, the electrode member 30d shown in FIGS. 10A and 10B can be fabricated.

Figure 11:
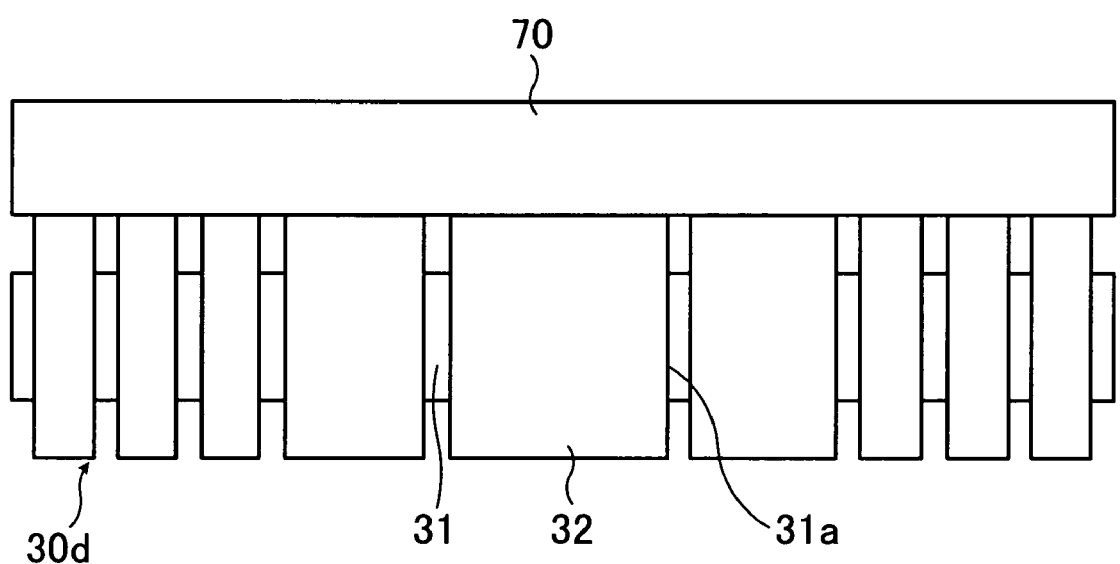
FIG. 11 shows an example of how an element is mounted on the electrode member according to the fifth embodiment of the present invention.

FIG. 11 shows an example of how an element is mounted on the electrode member according to the fifth embodiment of the present invention.

Usually thermal stress on an edge portion of a soldered interface between members is stronger than thermal stress on the center of the soldered interface. Accordingly, as with the electrode member 30d according to the fifth embodiment of the present invention, copper posts 32 each having a large cross-sectional area are formed in the center where thermal stress is light and many copper posts 32 each having a small cross-sectional area are formed in edge portions where thermal stress is strong. If a member 70 is soldered to the electrode member 30d, the formation of the above copper posts 32, combined with the effect of being able to increase the thickness of a solder layer (not shown) by the length of an end portion of each copper post 32 which protrudes from a side of the support 31, suppresses the appearance of a crack at a soldered interface.

In this example, end portions of each copper post 32 protrude from both sides of the support 31. However, only one end portion of each copper post 32 may protrude from one side of the support 31. In addition, end portions of each copper post 32 may not protrude from the support 31.

A sixth embodiment of the present invention will now be described.

Figure 12A:
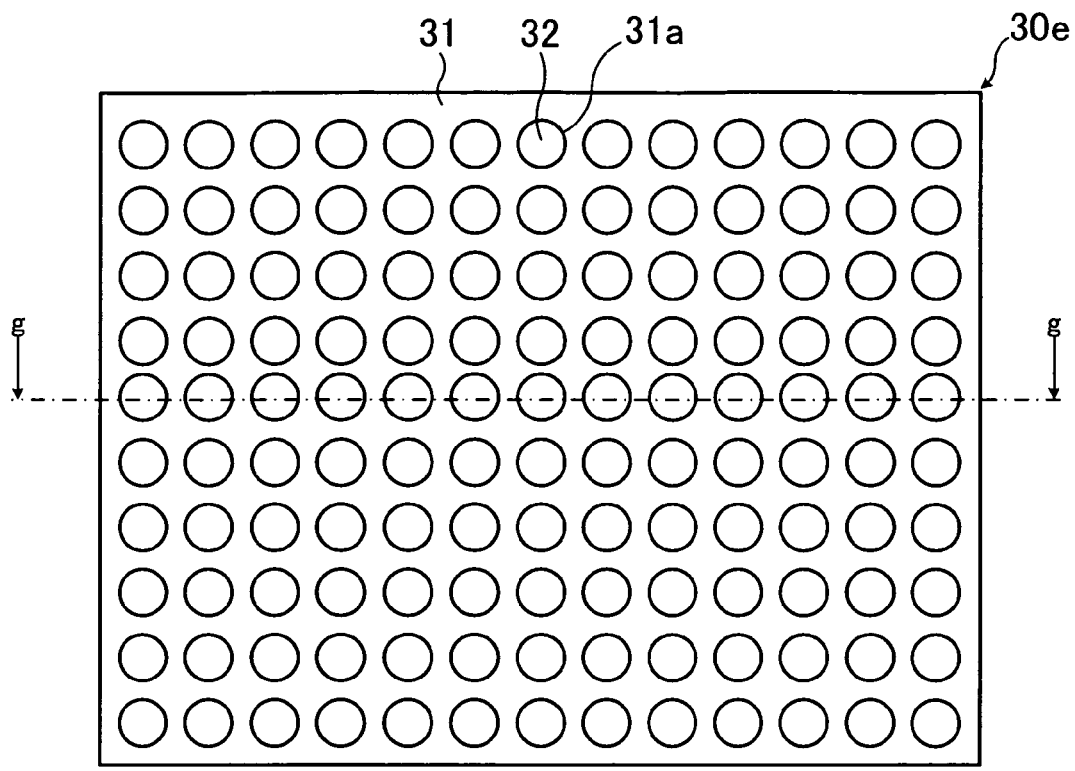
FIGS. 12A and 12B are schematic views of an electrode member according to a sixth embodiment of the present invention, FIG. 12A being a plan view of the electrode member, FIG. 12B being a sectional view taken along the line g-g of FIG. 12A.
Figure 12B:
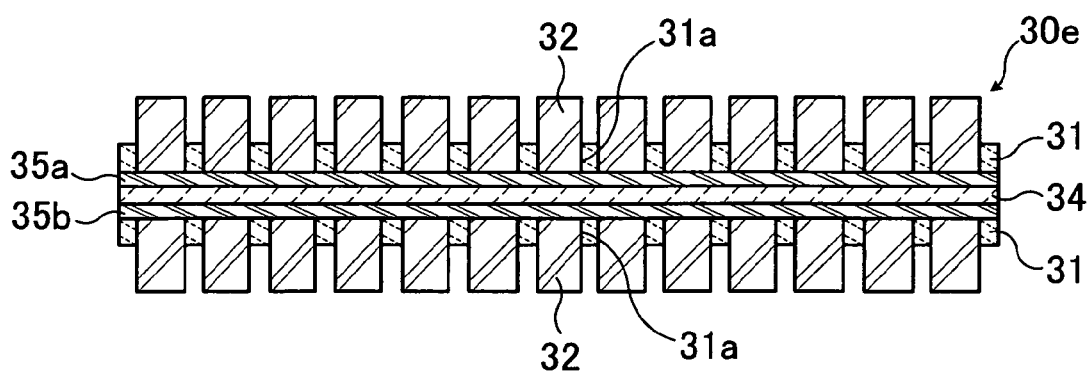

FIGS. 12A and 12B are schematic views of an electrode member according to a sixth embodiment of the present invention. FIG. 12A is a plan view of the electrode member. FIG. 12B is a sectional view taken along the line g-g of FIG. 12A. Components in FIGS. 12A and 12B that are the same as those shown in FIGS. 3A, 3B, 9A, and 9B are marked with the same reference numerals and detailed descriptions of them will be omitted.

As shown in FIG. 12B, an electrode member 30e according to the sixth embodiment of the present invention differs from the electrode member 30c according to the fourth embodiment of the present invention in that copper posts 32 which protrude from both sides of a support 31 are connected electrically and two-dimensionally to one another by copper layers 35a and 35b, respectively, located on the insulating plate 34.

For example, the electrode member 30e having the above structure is fabricated by the following method. Two objects which have the same structure and in each of which only one end portion of each copper post 32 protrudes from one side of a support 31 are fabricated. The insulating plate 34 on which the copper layers 35a and 35b are formed is then located between the other sides of the supports 31 where the other end portion of each copper post 32 does not protrude. This is the same with the electrode member 30c according to the fourth embodiment of the present invention.

Figure 13:
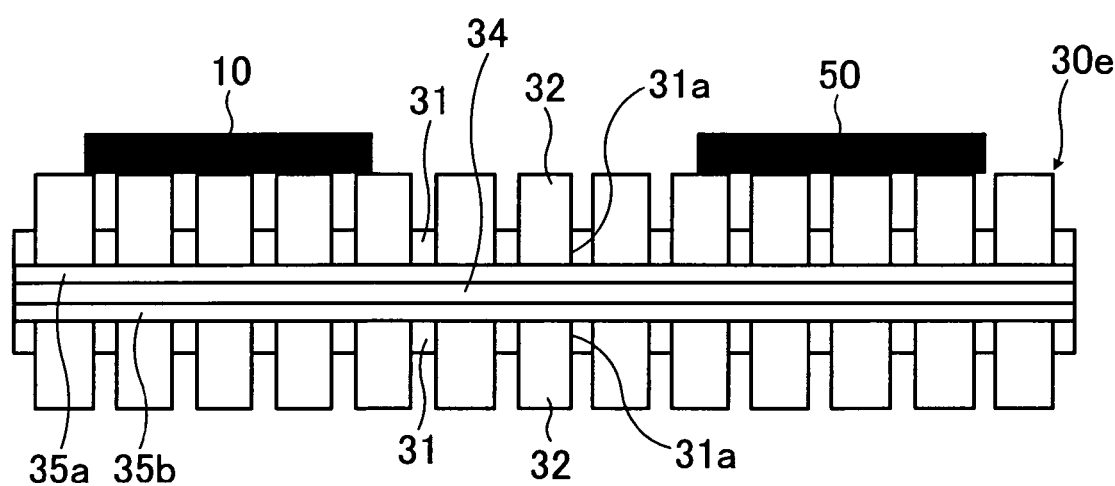
FIG. 13 shows an example of how an element is mounted on the electrode member according to the sixth embodiment of the present invention.

FIG. 13 shows an example of how an element is mounted on the electrode member according to the sixth embodiment of the present invention. Components in FIG. 13 that are the same as those shown in FIGS. 6A and 6B are marked with the same reference numerals and detailed descriptions of them will be omitted.

With the electrode member 30e according to the sixth embodiment of the present invention, the copper posts 32 on one side and the copper posts 32 on the other side are electrically connected to one another by the copper layers 35a and 35b respectively. Accordingly, when an IGBT 10 and an FWD 50 are soldered directly onto the electrode member 30e, electrical connection can be secured on the side where the elements are mounted. Moreover, the electrode member 30e itself can be used as an insulating board for insulating the side where the elements are mounted from the side of a heat radiation base. As a result, it is possible to thermally connect members soldered with the electrode member 30e between while securing two-dimensional electrical connection on each side of the electrode member 30e. In addition, distortion at each soldered interface between members can be reduced and the appearance of a crack can be suppressed.

In this example, end portions of each copper post 32 protrude from both sides of the support 31. However, only one end portion of each copper post 32 may protrude from one side of the support 31. In addition, end portions of each copper post 32 may not protrude from the support 31. In this example, the copper layer 35a is formed on one side of the insulating plate 34 and the copper layer 35b is formed on the other side of the insulating plate 34. However, the copper layer 35a or 35b may be formed only on one side of the insulating plate 34.

A seventh embodiment of the present invention will now be described.

Figure 14A:
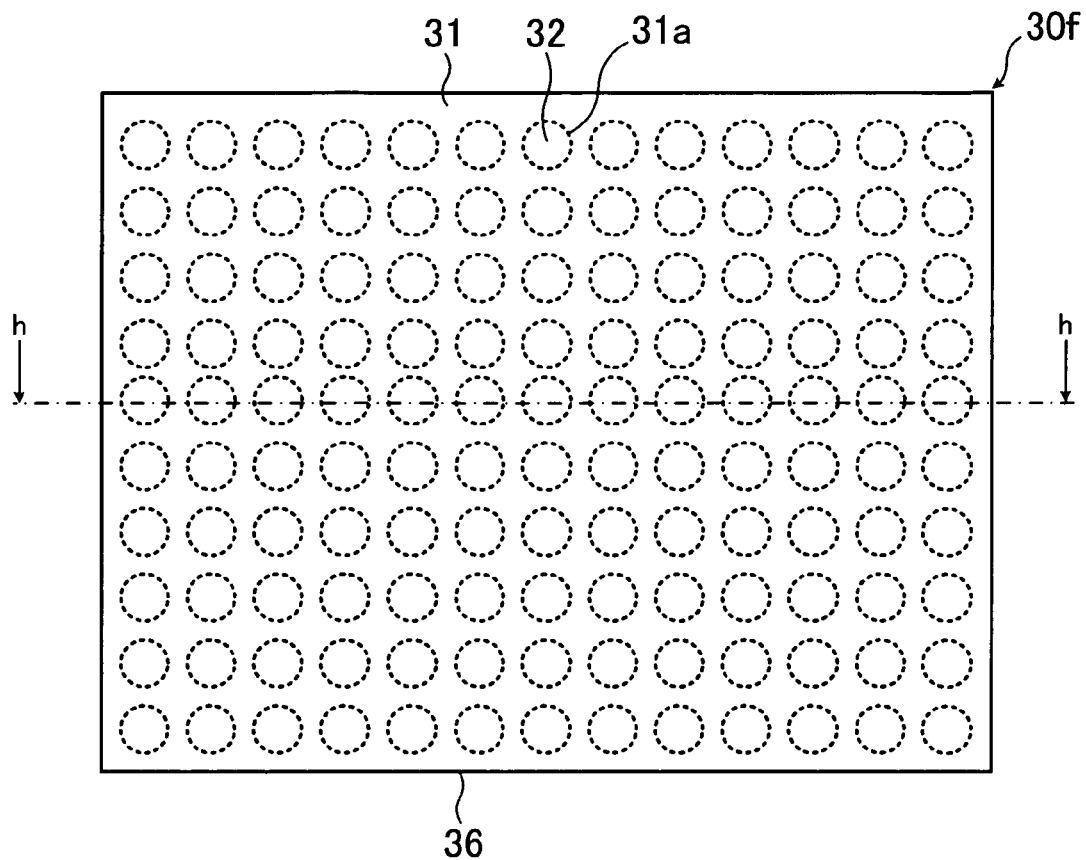
FIGS. 14A and 14B are schematic views of an electrode member according to a seventh embodiment of the present invention, FIG. 14A being a plan view of the electrode member, FIG. 14B being a sectional view taken along the line h-h of FIG. 14A.
Figure 14B:
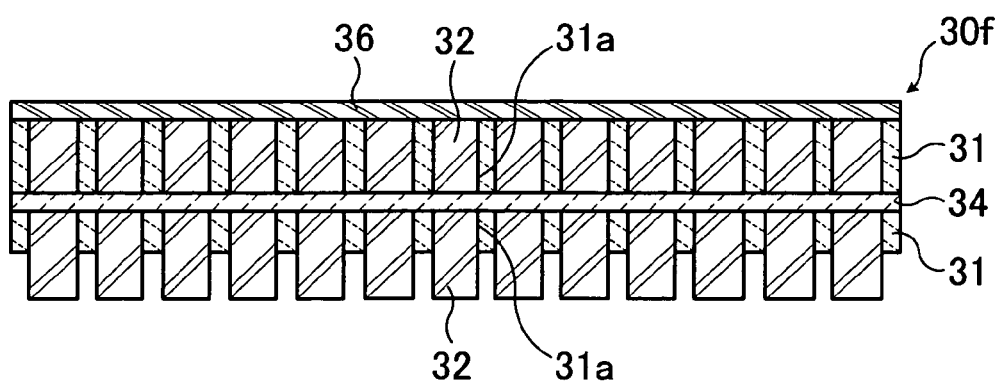

FIGS. 14A and 14B are schematic views of an electrode member according to a seventh embodiment of the present invention. FIG. 14A is a plan view of the electrode member. FIG. 14B is a sectional view taken along the line h-h of FIG. 14A. Components in FIGS. 14A and 14B that are the same as those shown in FIGS. 3A, 3B, 9A, and 9B are marked with the same reference numerals and detailed descriptions of them will be omitted.

As shown in FIG. 14B, an electrode member 30f according to the seventh embodiment of the present invention differs from the electrode member 30c according to the fourth embodiment of the present invention in that one end portion of each copper post 32 protrudes from one side of a support 31 and that the other end portion of each copper post 32 does not protrude from the other side of the support 31 and is connected electrically and two-dimensionally to the other end portions by a copper layer 36.

For example, the electrode member 30f having the above structure is fabricated by the following methods. A first method is as follows. The copper posts 32 are formed first in perforations 31a cut in the support 31. As described in the second embodiment, for example, the perforations 31a are cut and the copper layer 36 is formed by attaching a copper leaf to one side of the support 31 or performing electroless plating. The perforations 31a are filled with copper by performing electroplating with the copper layer 36 as a seed. By doing so, the copper posts 32 are formed. Alternatively, the method of impregnating the support 31 with molten copper may be used. Two supports 31 are fabricated. With one support 31, the copper layer 36 is formed on one side. With the other support 31, only one end portion of each copper post 32 protrudes from one side. An insulating plate 34 is located between the sides of the two supports 31 where an end portion of each copper post 32 does not protrude. By doing so, the electrode member 30f shown in FIGS. 14A and 14B can be fabricated.

Figure 15:
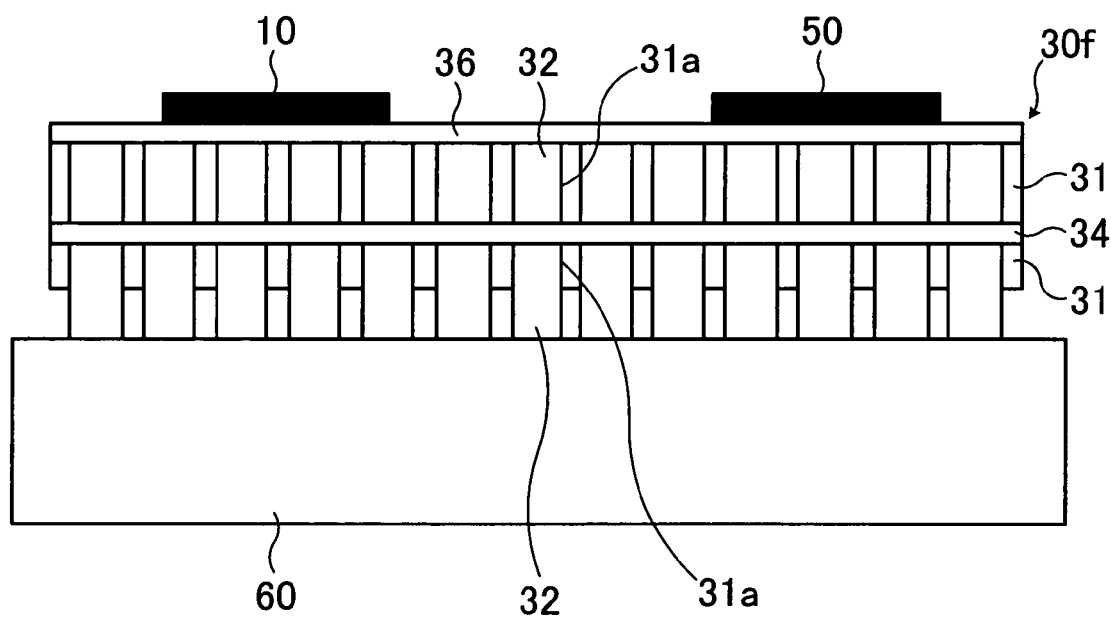
FIG. 15 shows an example of how an element is mounted on the electrode member according to the seventh embodiment of the present invention.

FIG. 15 shows an example of how an element is mounted on the electrode member according to the seventh embodiment of the present invention. Components in FIG. 15 that are the same as those shown in FIGS. 6A and 6B are marked with the same reference numerals and detailed descriptions of them will be omitted.

The electrode member 30f according to the seventh embodiment of the present invention is located between elements, such as an IGBT 10 and an FWD 50, and a copper base 60. As a result, electrical connection can be secured on the side where the elements are mounted, and the electrode member 30f itself can be used as an insulating board for insulating the side where the elements are mounted from the side of the heat radiation base. The copper layer 36 may be formed as a circuit pattern.

With the electrode member 30f one end portion of each copper post 32 protrudes from the support 31. If such structure is adopted, a cooling mechanism for passing a cooling medium between the electrode member 30f and the copper base 60 can be used.

Figure 16A:
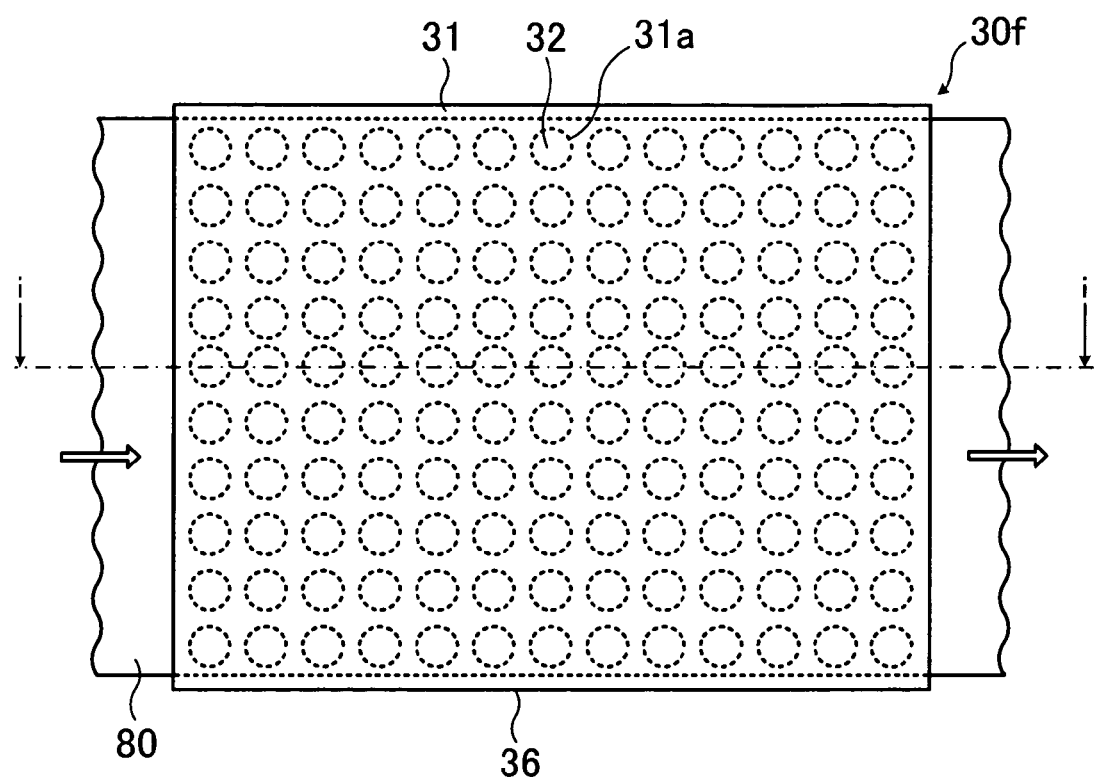
FIGS. 16A and 16B are schematic views of an electrode member with a cooling mechanism, FIG. 16A being a plan view of the electrode member, FIG. 16B being a sectional view taken along the line i-i of FIG. 16A.
Figure 16B:
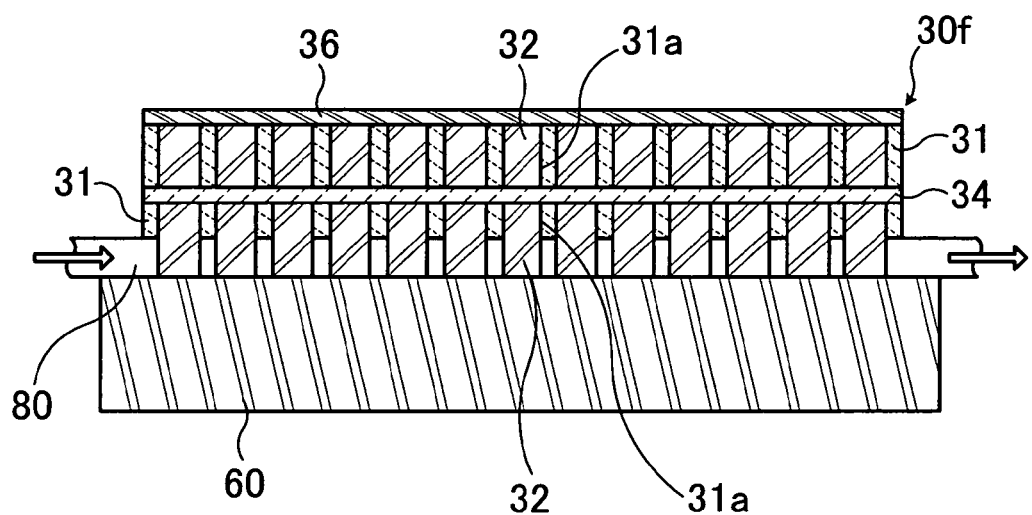
Figure 17:
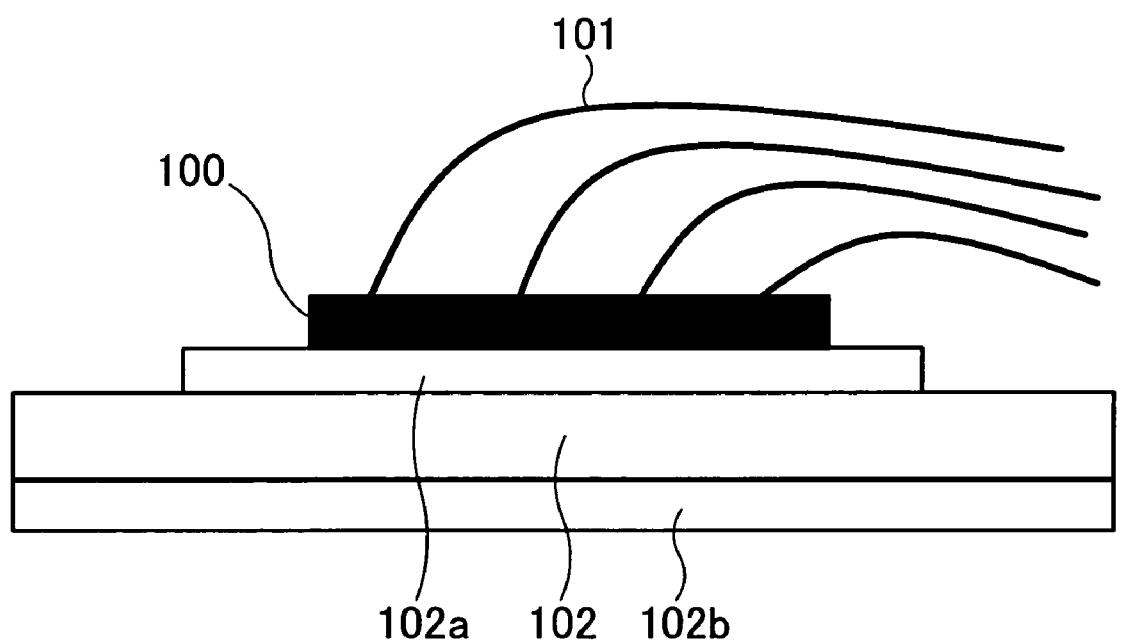
FIG. 17 is a schematic sectional view of an important part of a conventional power module.
Figure 18:
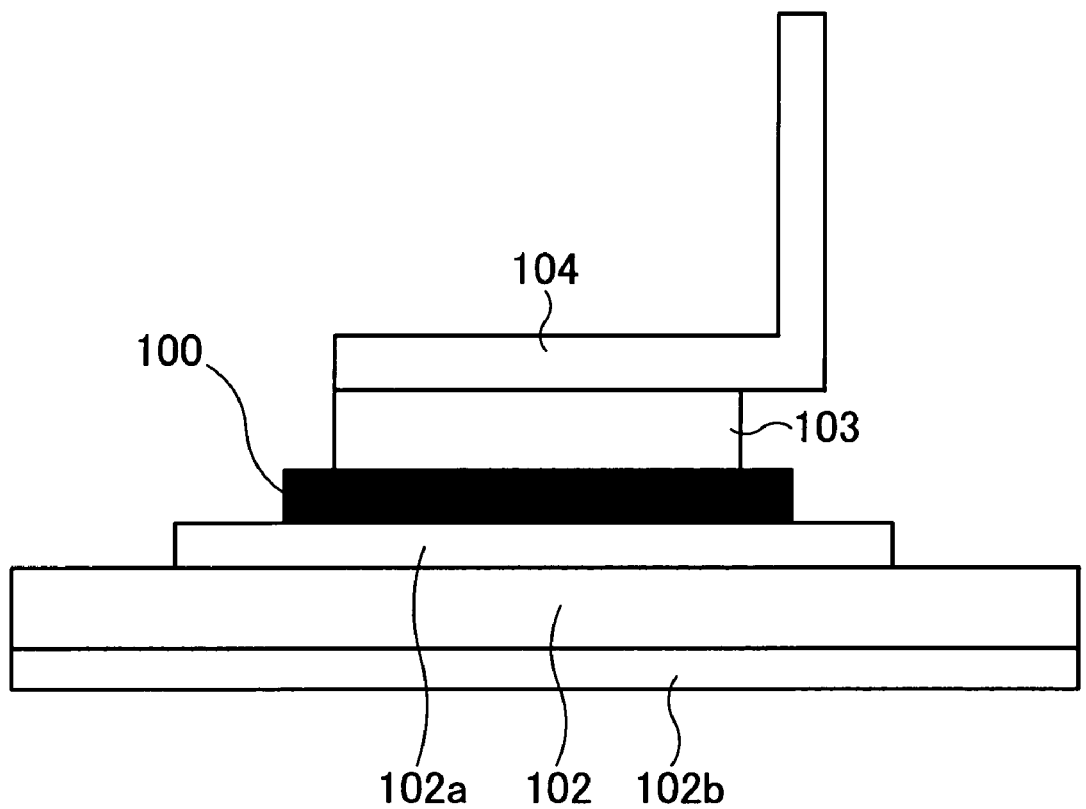
FIG. 18 is a schematic sectional view of an important part of another conventional power module.

FIGS. 16A and 16B are schematic views of an electrode member with a cooling mechanism. FIG. 16A is a plan view of the electrode member. FIG. 16B is a sectional view taken along the line i-i of FIG. 16A. Components in FIGS. 16A and 16B that are the same as those shown in FIGS. 3A, 3B, 6A, 6B, 9A, and 9B are marked with the same reference numerals and detailed descriptions of them will be omitted.

If the electrode member 30f according to the seventh embodiment of the present invention, for example, is used in a power module, a cooling mechanism for removing heat by passing a cooling medium 80 through a space between the support 31 of the electrode member 30f and a copper base 60 is used as shown in FIGS. 16A and 16B. With this cooling mechanism, water, for example, is used as the cooling medium 80. The cooling medium 80 is introduced from the outside of the power module, passes through the space between the support 31 of the electrode member 30f and the copper base 60, and is discharged again to the outside of the power module. As a result, heat in the power module can directly be removed by using the cooling medium 80 and heat radiation is performed more effectively. Therefore, distortion at each soldered interface can be reduced and the appearance of a crack can be suppressed.

In FIGS. 16A and 16B, the description has been given with the case where the electrode member 30f according to the seventh embodiment of the present invention is used in a power module as an example. However, the above cooling mechanism is also applicable to the case where the electrode member 30b, 30c, 30d, or 30e having structure in which an end portion of each copper post 32 protrudes from one side of the support 31 is used in a power module.

As has been described in the foregoing, with the above electrode members 30 and 30a through 30f it is possible to relieve thermal stress at each soldered interface while efficiently radiating heat by applying the cooling mechanism at need. As a result, the occurrence of distortion can be suppressed and heat cycle resistance and power cycle resistance can be improved. Moreover, by locating each of the electrode members 30 and 30a through 30f on a side where an emitter electrode etc. are formed, the surface area and volume of a conductive portion can be increased compared with the case of aluminum wire bonding. This enhances a heat radiation effect and lowers electrical resistance. As a result, the generation of heat or deterioration in the characteristics of an element can be suppressed. In addition, with the electrode members 30 and 30a through 30f the support 31 may be thickened at need. For example, by doing so, a conventional copper base can be replaced by the support 31.

In the above examples, the case where solder is used for joining members is described. However, a conductive paste or the like which hardens by heat or light can be used in place of solder. In this case, each of the above electrode members 30 and 30a through 30f can also be used. As a result, heat can be radiated, and the appearance of a crack can be suppressed by reducing distortion at each interface between members joined with a conductive paste.

In the above examples, copper is used as a metal material for fabricating the electrode members 30 and 30a through 30f. However, another conductive metal, such as aluminum, having comparatively high thermal conductivity may be used.

In the above examples, electrode members of one type are used in one power module. However, it is a matter of course that electrode members of plural types may be used in one power module.

In the present invention, the electrode member in which a plurality of metal posts are formed is joined to an electrode of a semiconductor element. As a result, heat generated in the semiconductor element can efficiently be radiated, and distortion at each interface between members joined can be reduced by lessening the influence of the thermal expansivity of materials. Therefore, the appearance of a crack at each interface between members joined can significantly be suppressed and a semiconductor device with high reliability can be realized.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor device having a semiconductor element with an electrode on a surface, the device comprising an electrode member including:
    an insulating ceramic member with a plurality of perforations that pierce through principal planes of the insulating ceramic member; and
    a plurality of individual copper or aluminum posts that are embedded in the plurality of perforations, respectively, and are supported by the insulating ceramic member, each of the plurality of copper or aluminum posts being electrically and thermally connected to the electrode by a solder layer at an interface between the electrode and the copper or aluminum posts,
    wherein one end of each of the plurality of copper or aluminum posts is level with one principal plane of the insulating ceramic member and another end of each of the plurality of copper or aluminum posts is level with another principal plane of the insulating ceramic member.

2. The semiconductor device according to claim 1, wherein a conductor layer is formed on a principal plane of the electrode member joined to the electrode.

3. The semiconductor device according to claim 1, wherein in the electrode member, end portions of the metal posts protrude from at least one principal plane of the insulating support.

4. The semiconductor device according to claim 3, wherein a cooling medium can be passed between the metal posts which protrude from the insulating support and the surface where the metal posts are joined to the electrode.

5. The semiconductor device according to claim 1, wherein:
    the semiconductor element is an insulated gate bipolar transistor; and
    the electrode is at least one of an emitter electrode and a collector electrode of the insulated gate bipolar transistor.

6. The semiconductor device according to claim 1, wherein:
    the semiconductor element is a diode; and the electrode is at least one of an anode electrode and a cathode electrode of the diode.

7. The semiconductor device according to claim 1, wherein a radius of each of the plurality of copper or aluminum posts is larger than a distance between adjacent metal posts.

8. The semiconductor device according to claim 1, wherein the plurality of individual copper or aluminum posts are separated from each other by the insulating ceramic member.

9. An electrode member electrically and thermally connected to an electrode of a semiconductor device by a solder layer at an interface between the electrode and the electrode member, the member comprising:
- an insulating ceramic member with a plurality of perforations that pierce through principal planes of the insulating ceramic member; and
- a plurality of individual copper or aluminum posts embedded in the plurality of perforations, respectively, and supported by the insulating ceramic member,
- wherein one end of each of the plurality of copper or aluminum posts is level with one principal plane of the insulating ceramic member and another end of each of the plurality of copper or aluminum posts is level with another principal plane of the insulating ceramic member.

10. The electrode member according to claim 9, wherein:
- at least one end of each of the metal posts is on a principal plane of the insulating support; and
- a conductor layer is formed on the principal plane.

11. The electrode member according to claim 9, wherein end portions of the metal posts protrude from at least one principal plane of the insulating support.

12. The electrode member according to claim 9, wherein:
- diameters of metal posts located in the center of the insulating support are larger than diameters of metal posts located in edge portions of the insulating support; and
- density of the metal posts located in the edge portions of the insulating support is higher than density of the metal posts located in the center of the insulating support.

13. The electrode member according to claim 9, wherein the metal posts are formed by using copper or aluminum.

14. The electrode member according to claim 9, wherein the plurality of individual copper or aluminum posts are separated from each other by the insulating ceramic member.

15. A semiconductor device having a semiconductor element with an electrode on a surface, an electrode member being electrically and thermally connected to the electrode by a solder layer at an interface between the electrode and the electrode member, the electrode member including:
- an insulating ceramic member with a plurality of perforations that pierce through principal planes of the insulating ceramic member; and
- a plurality of individual copper or aluminum posts embedded in the plurality of perforations, respectively, and supported by the insulating ceramic member,
- wherein one end of each of the plurality of copper or aluminum posts is level with one principal plane of the insulating ceramic member and another end of each of the plurality of copper or aluminum posts is level with another principal plane of the insulating ceramic member.

16. The semiconductor device according to claim 15, wherein a radius of each of the plurality of copper or aluminum posts is larger than a distance between adjacent metal posts.

17. The semiconductor device according to claim 15, wherein the plurality of individual copper or aluminum posts are separated from each other by the insulating ceramic member.

* * * * *